United States Patent
Dean et al.

(10) Patent No.: US 10,669,642 B2
(45) Date of Patent: Jun. 2, 2020

(54) USING DISPERSION AGENTS TO CHEMICALLY STABILIZE DYEING OF METAL PARTS

(71) Applicant: Apple Inc., Cupertino, CA (US)

(72) Inventors: James A. Dean, Cupertino, CA (US); James A. Curran, Morgan Hill, CA (US)

(73) Assignee: APPLE INC., Cupertino, CA (US)

(*) Notice: Subject to any disclaimer, the term of this patent is extended or adjusted under 35 U.S.C. 154(b) by 38 days.

(21) Appl. No.: 15/715,014

(22) Filed: Sep. 25, 2017

(65) Prior Publication Data

US 2019/0093251 A1 Mar. 28, 2019

(51) Int. Cl.
| | |
|---|---|
| *C25D 11/22* | (2006.01) |
| *H05K 5/00* | (2006.01) |
| *H05K 5/04* | (2006.01) |
| *C25D 11/16* | (2006.01) |
| *C25D 11/24* | (2006.01) |
| *C25D 11/08* | (2006.01) |
| *C25D 11/04* | (2006.01) |

(52) U.S. Cl.
CPC .............. *C25D 11/22* (2013.01); *C25D 11/16* (2013.01); *C25D 11/243* (2013.01); *C25D 11/246* (2013.01); *H05K 5/0086* (2013.01); *H05K 5/04* (2013.01); *C25D 11/04* (2013.01); *C25D 11/08* (2013.01)

(58) Field of Classification Search
CPC ......... C25D 11/02; C25D 11/08; C25D 11/16; C25D 11/18; C25D 11/22; C25D 11/243; C25D 11/246
See application file for complete search history.

(56) References Cited

U.S. PATENT DOCUMENTS

| | | | | |
|---|---|---|---|---|
| 5,064,512 A | * | 11/1991 | Brodalla | ................ C25D 11/22 205/202 |
| 2004/0067613 A1 | | 4/2004 | Murofushi et al. | |
| 2008/0149492 A1 | * | 6/2008 | Lin | ........................ C25D 11/02 205/206 |
| 2014/0076600 A1 | * | 3/2014 | Browning | ............... C23C 28/04 174/50 |
| 2015/0056549 A1 | | 2/2015 | Ikeda et al. | |
| 2015/0371787 A1 | | 12/2015 | Ko et al. | |
| 2017/0121838 A1 | | 5/2017 | Tatebe et al. | |

* cited by examiner

*Primary Examiner* — Elizabeth E Mulvaney
(74) *Attorney, Agent, or Firm* — Dorsey & Whitney LLP

(57) ABSTRACT

This application relates to a part that includes a metal oxide layer having pore structures. In some embodiments, dye molecules having aromatic rings can be disposed within at least one of the pore structures. Additionally, the at least one pore structures can include dispersion molecules, where the dispersion molecules form non-covalent interactions with the dye molecules. By forming non-covalent interactions between the dye molecules and the dispersion molecules, the aromatic rings of the dye molecules are prevented from forming other non-covalent interactions with other dye molecules. Additionally, techniques for chemically stabilizing the color dye bath for dyeing anodized parts are also described.

19 Claims, 13 Drawing Sheets

USING DISPERSION AGENTS TO CHEMICALLY STABILIZE DYEING OF METAL PARTS

FIELD

The described embodiments relate generally to techniques for dyeing metal parts. More particularly, the described embodiments relate to systems and methods for using dispersion agents to chemically stabilize anodic dye baths for dyeing anodized aluminum parts.

BACKGROUND

Conventionally, aluminum parts can be made to appear as if they are imbued with specific colors using various processes that utilize a dye agent. Prior to the color dyeing process, the metal parts are subjected to various processes (e.g., anodization, machining, blasting, etc.) in order to prepare these metal parts for the color dyeing process. Thus, a considerable amount of time, expense, and effort is directed towards preparing these metal parts for the color dyeing process. During the color dyeing process, multiple runs of metal parts can be dyed using a single dye bath. However, the chemical properties of dye molecules present in the dye bath can result in non-uniform dye uptake by any given metal part, or from part-to-part within a batch of metal parts in a given dye bath, uncontrolled variation in color with time, and a significantly reduced useful life of the dye bath.

SUMMARY

This paper describes various embodiments that relate to techniques for dyeing metal parts. In particular, the various embodiments relate to systems and methods for using dispersion agents to chemically stabilize anodic dye baths that are used to dye anodized aluminum parts, improve color consistency, and prolong the useful bath life of anodic dye baths.

According to some embodiments, a part is described. The part can include a metal oxide layer having pore structures. According to some embodiments, at least one of the pore structures can include a dispersant—dye aggregate having a dye molecule that includes at least one aromatic ring and one or more dispersion molecules having a non-covalent interaction with the at least one aromatic ring such that the dispersant—dye aggregate is formed preferentially over larger ordered stacks of the dye molecule.

According to some embodiments, a method for dyeing a metal oxide layer of a part, the metal oxide layer including a columnar pore structure with an average pore diameter is described. The method can include exposing the metal oxide layer to a stabilized dye solution, the stabilized dye solution including dispersant-dye aggregates or micelles characterized as having a disordered stacking structure, where the dispersant-dye aggregates include (i) one or more dye molecule shaving at least one aromatic ring, and (ii) a dispersion molecule having a non-covalent interaction with the at least one aromatic ring, where the aggregation of the dye molecules and the dispersion molecule hinders more extensive agglomeration of the dye molecules and prevents formation of dye agglomerates having an average size that is larger than the average diameter of the pores.

According to some embodiments, an enclosure for a portable electronic device is described. The enclosure can include a metal substrate and a metal oxide layer formed from and disposed over the metal substrate. In some embodiments, the metal oxide layer can have pore structures that include dye molecules that imbue the metal oxide layer with a color. Additionally, the pore structures can have dispersion molecules including at least one aromatic ring having non-covalent interactions with the dye molecules such that the dye molecules are non-agglomerated and wherein the dye molecules penetrate deeply into the pore structures of the metal oxide layer, thereby causing the metal oxide layer to be imbued with a uniform appearance of the color and to avoid complications associated with larger dye molecules or agglomerated dye molecules disposed predominantly near an outer surface of the metal oxide layer.

This Summary is provided merely for purposes of summarizing example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
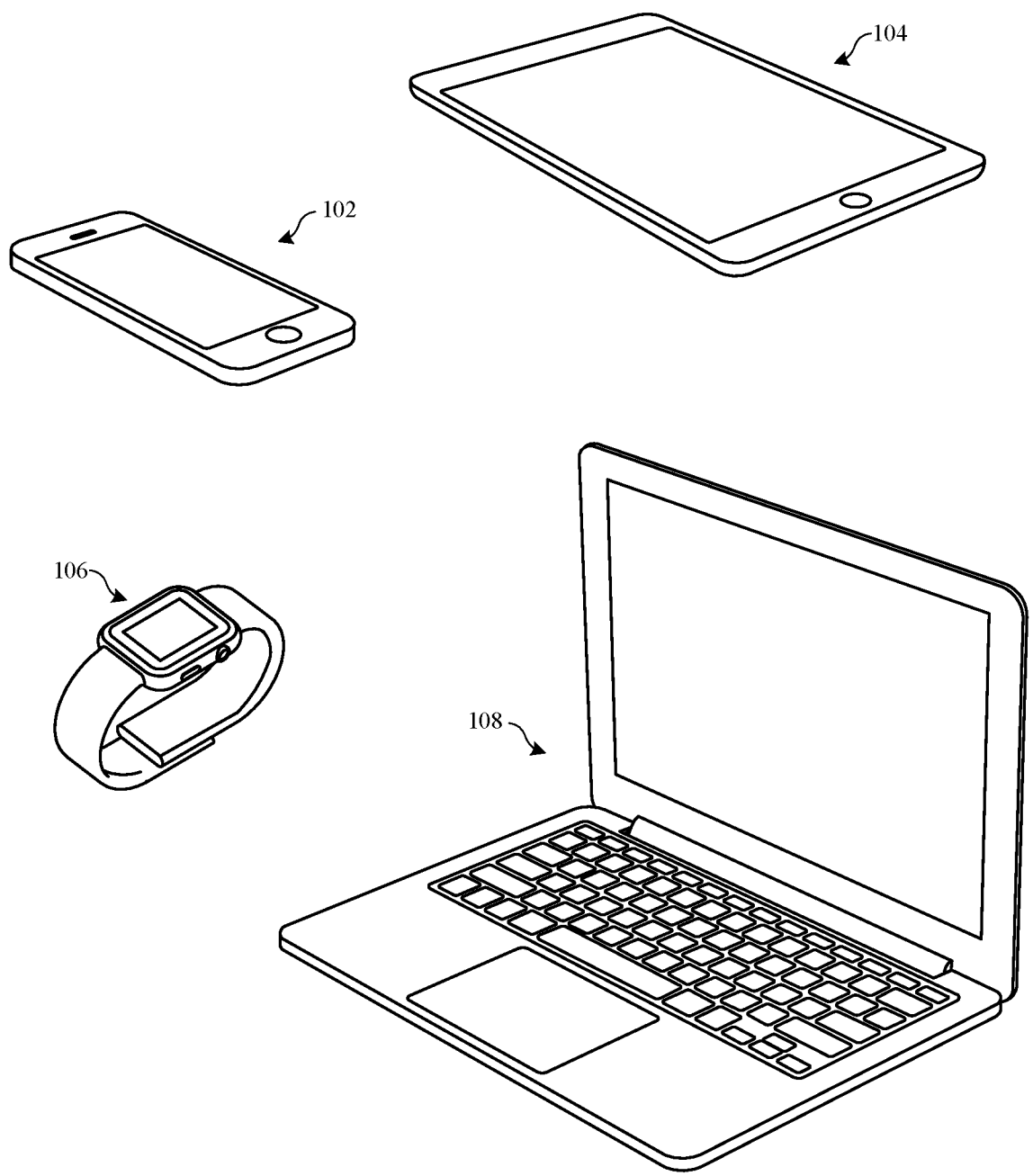
FIG. 1 illustrates perspective views of various devices having metallic surfaces that can be dyed using the chemically stabilized color dye baths described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth techniques for chemically stabilizing a color dye bath that includes a dye solution that is used to process an anodized layer of a part. In particular, the anodized layer can be infused with dye molecules to impart the anodized layer with a specific color. For instance, during a color dyeing process, multiple flight bars of anodized parts (e.g., thousands or tens of thousands of parts, etc.) are dyed using a color dye bath. The physical and chemical properties of both the pore structures of the metal oxide layer and of the dye molecules (e.g., size, charge and structure, etc.) that are present in the dye solution can affect the absorption rate of these dyes molecules within the pore structures of the metal oxide layer.

A major factor in hindering the uptake of dye molecules into the metal oxide layer is the agglomeration of the dye molecules, which can increase their effective size, and render them too large to easily penetrate into the limited cross-section of cylindrical structures of the metal oxide layer. In one particularly effective and self-propagating mechanism of agglomeration, the dye molecules can agglomerate to form ordered π stacking systems that can be characterized as two parallel aromatic rings that overlap one another. In the π stacking system, a partial positive charge of an aromatic ring of a dye molecule can be attracted to a partial negative charge of an aromatic ring of another dye molecule. Ordered stacking systems of these dye molecules can be characterized as having aromatic rings, or sets of two or more adjacent, conjugated aromatic rings (e.g., in a single plane) that can interact with each other via non-covalent interactions to form stacked agglomerates of two or more dye molecules. In some cases, isomerism or non-planarity inhibits stacking, but in other cases, the aromatic rings of different dye molecules line up perfectly with each other and can thus all be involved in inter-molecular bonding. Consequently, this can strengthen the interactions between these dye molecules and leave a pair of stacked dye molecules open to additional stacking on either side. Moreover, the stronger magnetism exhibited by a set of aromatic rings that are stacked can result in even faster and stronger interactions with additional dye molecules, often resulting in large agglomerated stacks. In some instances, as the agglomerated stacks grow in size they become progressively less able to enter into the pore structures of the metal oxide layer and to penetrate deeply along high aspect ratio columnar pores, thereby greatly hindering uptake of the dye molecules into the metal oxide layer.

For example, with a conventional anodic dying operation, a single flight bar may include several hundred or several thousand anodized parts that are exposed to the color dye bath. During a typical run, after five flight bars (~1500 anodized parts) have been dyed using the color dye bath, the anodic dying operation using the color dye bath may only yield about 50-70% of dyed anodized parts that satisfy strict color tolerances. Furthermore, the percentage of dyed anodized parts that satisfy the strict color tolerances drops dramatically for each subsequent flight bar that is dyed using the color dye bath. This result is especially alarming when one considers the significant amount of upstream time, expense, and effort that is required in order to prepare each of these anodized parts for the color dyeing process. For instance, these processes can include a computerized numerical control (CNC) machining operation, a pre-texturizing process (such as lapping or blasting), and an anodization process. Those anodized parts that do not satisfy the color tolerances are generally discarded as current technologies are unable to correct the dyed color of these dyed anodized parts without adversely affecting other attributes. Additionally, it is noted that the observed drop-off in color absorption may be more prevalent in certain color dyes, such as rose gold, where the dye molecules are characterized as having three or more conjugated aromatic rings in a plane, which make these dye molecules particularly susceptible to agglomeration by pi stacking. Neither can alternative technologies be implemented to correct these colors. For example, simply correcting for rose gold in one color dimension (of an L*a*b* space) can cause another color dimension to drift out of spec limits. In other words, one of ordinary skill in the art cannot simply correct one color dimension value in isolation of other color dimension values.

Previously, certain attempts at monitoring and correcting the aforementioned problems has been undertaken—without success. For example, one attempt at improving dye uptake in anodized parts involves monitoring the concentration of dye molecules present in the color dye bath. However, attempts at quantifying the concentration of dye molecules (e.g., ultraviolet-visible spectroscopy, near-infrared spectroscopy, visible transmission spectroscopy, ion chromatography, near-infrared spectroscopy, etc.) were inaccurate and unable to predict the color shift in the dyed anodized part because the combination of organic and inorganic species are absorbed within the pore structures of the anodized part at different rates. Although the aforementioned techniques are unable to accurately quantify the color shift in the color dye bath, these dye molecules in the color dye bath appear to be clearly and visibly agglomerating which results in the aforementioned problems.

Accordingly, some techniques described herein for preventing and/or minimizing agglomeration of dye molecules includes chemically stabilizing the color dye bath by implementing a dispersion agent that competes with other dye molecules to form interactions with the aromatic rings of dye molecules. According to some embodiments, the dispersion agent can include at least one aromatic ring that readily forms interactions with the available electrons of the aromatic rings of the dye molecules or a system of adjacent planar conjugated aromatic rings corresponding to a system of conjugated aromatic rings in the targeted dye molecule. In some examples, the dispersant agents may be smaller and more mobile than the dye molecules, and/or the dispersant agents can be present at a higher concentration than the dye molecules, and thus more likely to interact with the dye molecules than other dye molecules. Moreover, once one or more dispersant agents form a "micelle" with a dye molecule, further stacking and agglomeration of dye molecules is inhibited. Thus, the dispersion agent can prevent and/or minimize formation of agglomerated dye molecules and improve color uptake into the metal oxide layer without altering the existing concentration of the dye molecules present in the dye solution. In some examples, the dispersion agent can include naphthalene sulfonic acid (e.g., 1-naphthalene sulfonic acid, 2-naphthalene sulfonic acid, and/or sulfonate molecules of these acids, etc.).

It should also be noted that it is preferable that whichever solution for preventing and/or minimizing agglomeration among dye molecules that is implemented does not interfere with downstream operations subsequent to the color dyeing process such as a sealing process for filling the pore structures of the metal oxide layer. It should also be noted that the sealant that fills the pore structures prevents exposure of the pore structures and/or metal substrate to contaminants and degradation agents. Thus, in some embodiments, the chemical agent for chemically stabilizing the color dye baths to prevent and/or minimize agglomeration should be compatible with the sealing process in order to prevent compromising the quality of the sealant and/or complicate any subsequent color dyeing processes. According to some embodiments, naphthalene sulfonic acid (e.g., 1-naphthalene sulfonic acid, 2-naphthalene sulfonic acid, and/or sulfonate molecules of these acids, etc.) can be implemented as an effective dispersion agent to chemically stabilize the color dye bath without negatively impacting the sealing process. In particular, naphthalene sulfonic acid can prevent and/or minimize ordered stacking among specific organic dye molecules having aromatic rings in order to prolong the useful life of the dye solution, improve uniformity of color absorption across multiple batches of dyed anodized parts, increase the percentage yield of anodized parts that satisfy strict color tolerances, improve chromaticity, and achieve a higher degree of control over dye penetration depth within the pore structures. Additionally, naphthalene sulfonic acid can also function as a wetting agent during the downstream sealing process. Thus, naphthalene sulfonic acid can be implemented as an effective dispersion agent to prevent and/or minimize agglomeration among dye molecules without compromising the seal. Other examples of dispersion agents that are capable of chemically stabilizing the dye solution without affecting any downstream processes are also described herein.

According to some embodiments, a part is described. The part can include a metal oxide layer having pore structures. According to some embodiments, at least one of the pore structures can include a dispersant-dye agglomerate having a dye molecule that includes an aromatic ring, and a dispersion molecule having a non-covalent interaction with the aromatic ring such that the dispersant-dye agglomerate comprises a disordered stacking structure.

As used herein, the terms anodic film, anodized film, anodic layer, anodized layer, anodic oxide coating, anodic layer, anodic oxidized layer, metal oxide layer, oxide film, oxidized layer, and oxide layer are used interchangeably and refer to any appropriate oxide layers. The anodic layers are formed on metal surfaces of a metal substrate. The metal substrate can include any of a number of suitable metals or metal alloys. In some embodiments, the metal substrate includes pure aluminum or aluminum alloy. In some embodiments, suitable aluminum alloys include 1000, 2000, 5000, 6000, and 7000 series aluminum alloys.

These and other embodiments are discussed below with reference to FIGS. 1, 2, 3A-3C, 4A-4B, 5-7, and 8A-8C. However, those skilled in the art will readily appreciate that the detailed description given herein with respect to these figures is for explanatory purposes only and should not be construed as limiting.

FIG. 1 illustrates various portable devices that can be processed using the techniques as described herein. The techniques as described herein can be used to process metallic surfaces (e.g., anodic oxide coatings, etc.) of portable devices. FIG. 1 illustrates a smartphone 102, a tablet computer 104, a smartwatch 106, and a portable computer 108. According to some embodiments, the metallic surfaces can refer to a metal substrate overlaid by a metal oxide layer. In particular, the metal oxide layer can function as an additional protective coating to protect the metal substrate, for example, when these portable devices are dropped, scratched, chipped, or abraded. The metal oxide layers include pore structures that are formed through the metal oxide layer and can extend from an external surface of the metal oxide layer to a barrier layer that separates the metal oxide layer from the underlying metal substrate.

According to some embodiments, each of the pore structures can be capable of receiving dye particles which can imbue the metal oxide layer with a specific color associated with the dye particles. In some examples, the metal oxide layer can include multiple, different dye colors.

Figure 2:
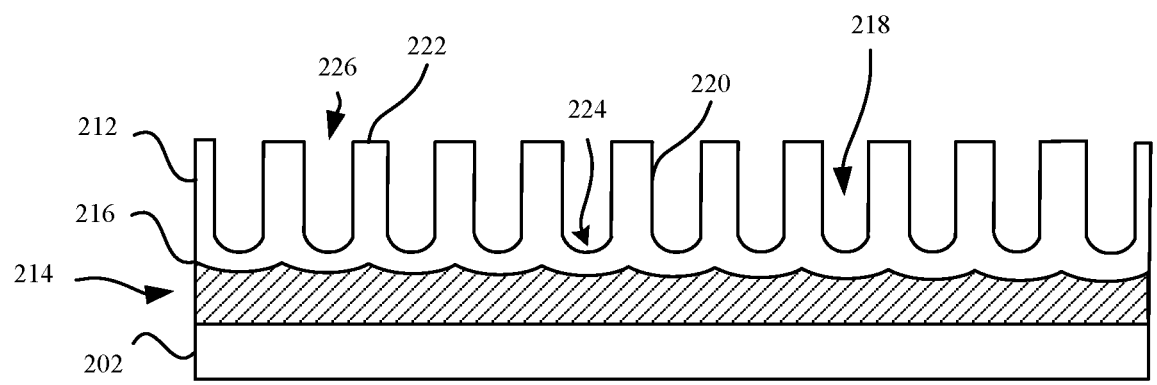
FIG. 2 illustrates a cross-sectional view of a metal part in conjunction with an anodization process, in accordance with some embodiments.

FIG. 2 illustrates a cross-sectional view of an anodized part subsequent to an anodization process, in accordance with some embodiments. FIG. 2 illustrates a cross-sectional view of an anodized part 210 including a metal oxide layer 212 subsequent to an anodization process. According to some examples, the metal substrate 202 can include aluminum or an aluminum alloy that is capable of being oxidized. Additionally, the thickness of the metal substrate 202 can be such so as to provide sufficient structural rigidity to the anodized part 210. During the anodization process, a portion of the metal substrate 202 can be converted to the metal oxide layer 212. According to some examples, during the anodization process, the metal substrate 202 includes aluminum, which is converted to aluminum oxide ($Al_2O_3$). Any alloying elements within the metal substrate 202 will either become oxidized and incorporated within the metal oxide layer 212, or become enriched at the interface region 214 (or barrier layer).

The metal oxide layer 212 can include pore structures 218 characterized as having cavities or channels defined by pore walls 220 and a terminus 224. These pore structures 218 can be defined by pore walls 220 that are characterized as having generally columnar shapes that are elongated in a direction generally perpendicular to a central plane of an exterior surface 222 of the metal oxide layer 212. In some examples, each of the pore structures 218 can have a cup-like shape at its terminus 224 near an interface region 214 (or barrier layer) that is positioned between the metal oxide layer 212 and the metal substrate 202. In some examples, the interface region 214 is non-porous (i.e., does not include pore structures). For example, the non-porous nature of the interface region 214 can prevent gas or liquids from entering the metal substrate 202 via the pore structures 218. Additionally, the interface region 214 can include an interface border 216 having a generally columnar border that corresponds to the generally columnar shapes of the pore structures 218.

It should be noted that the cross-sectional view of the anodized part illustrated in FIG. 2 is by way of example and is greatly shortened for purposes of clarity. In some examples, the metal oxide layer 212 has a thickness between about 5 micrometers to about 20 micrometers, while typical diameters of the pore structures 218 range between about 10 an to about 30 nm, thereby imparting typical pore aspect ratios of the order of 1000:1, which are reduced to about 3:1 as illustrated in FIG. 2.

Figure 3A:
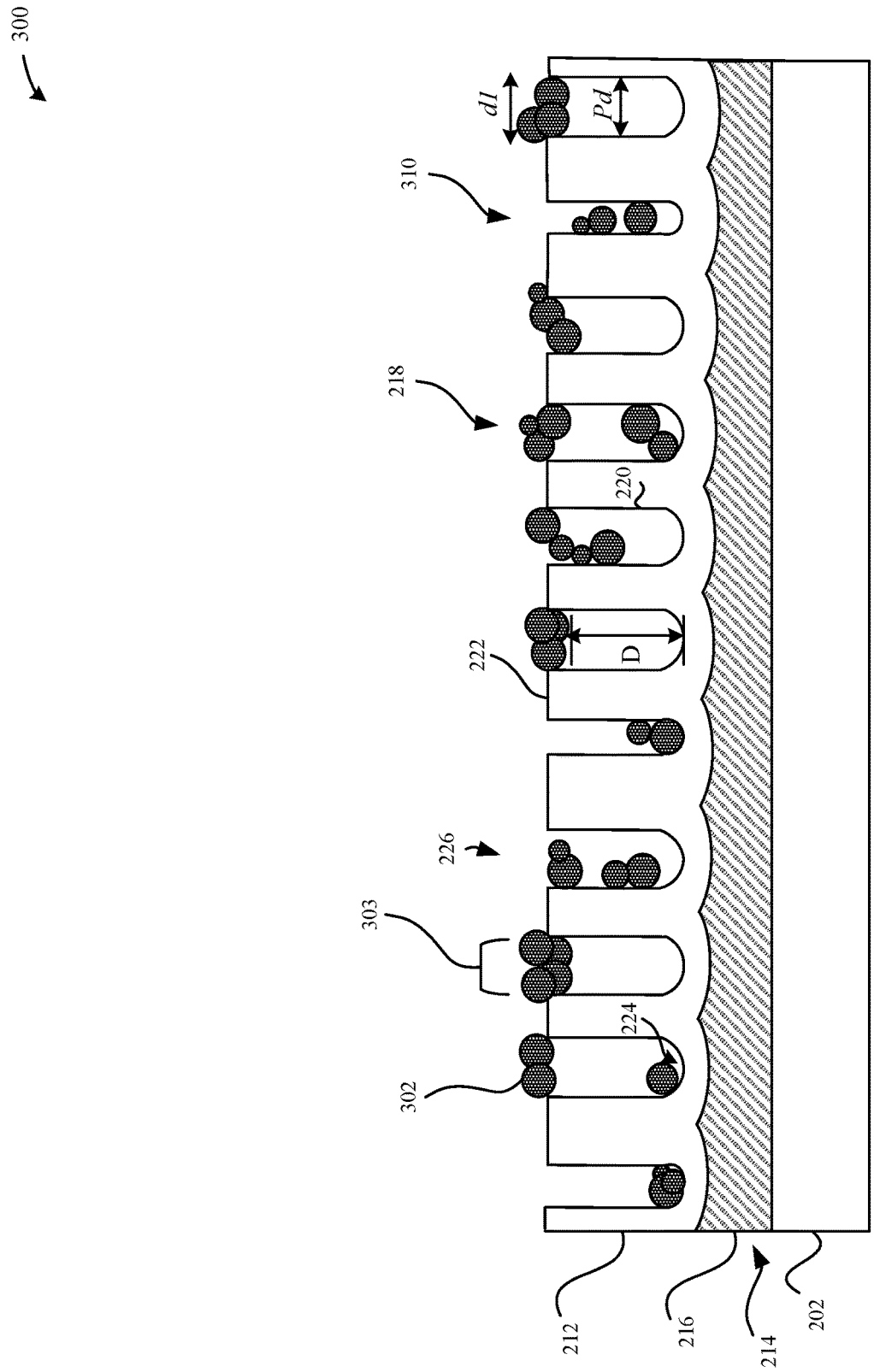
FIG. 3A illustrates a cross-sectional view of a metal oxide layer having agglomerated dye molecules that fill pore structures of the metal oxide layer, in accordance with some embodiments.

FIG. 3A illustrates a cross-sectional view of an exemplary dyed anodized part 300 subsequent to a conventional color dyeing process (i.e., non-stabilized color dyeing process). The aromatic rings of multiple dye molecules 302 are capable of interacting with each other to form π stacking (also referred to as π-π interactions, pi stacking, or pi-pi interactions). Ordered stacking of these dye molecules 302 can be characterized as having aromatic rings that interact with each other via a non-covalent interaction to form stacks of two or more agglomerated dye molecules 303. Further exacerbating the π stacking system is because each of these dye molecules 302 have nearly identical shapes, the aromatic rings line up in near perfectly ordered stacking to form agglomerated dye molecules 303.

Consider, for example, that a dye molecule 302 has a maximum dimension (d1) along its length of about 2 nanometers (corresponding to a width of about 3 nanometers of adjacent aromatic rings), and a thickness of about 0.5 nanometers (corresponding to an out of plane dimension of an aromatic ring). As additional dye molecules 302 are added to a π stacking system, the thickness of the agglomerated dye molecules 303 increases rapidly to match the in-plane maximum dimension (d1) such that the thickness of the agglomerated dye molecules 303 corresponds to the maximum dimension (d1), which can exceed the length of about 2 nanometers after about six dye molecules 302 are stacked together. This process can continue until the maximum dimension (d1) becomes a significant fraction of the pore diameter of the pore structures 218 (e.g., 10 to 15 nanometers). As the maximum dimension (d1) of the agglomerated dye molecules 303 approaches or exceeds the diameter of the pore structures of the metal oxide layer 212, the dye molecules 302 are progressively less able, and ultimately unable to penetrate into the pore structures 218. Consequently, this can prevent the agglomerated dye molecules 303 from not being absorbed into the pore structures 218 of the metal oxide layer 212, but can also clog the pore openings 226, and in doing so, the agglomerated dye molecules 303 can prevent additional dye molecules 302 from being taken up by the pore structures 218. In other instances, the dye molecules 302 may be taken up into the pore structures 218 but due to their chemical and physical properties, the agglomerated dye molecules 303 is penetrating deeply into the pores (which, it should be recalled, have aspect ratios of ~1000:1), let alone reaching the terminus 224 of the pore structures 218. Accordingly, this variation in uptake of dye molecules 302 into each of the pore structures 218 can account for the lack of color stability and non-uniform color absorption.

Consequently, as illustrated in FIG. 3A, the conventional dyed anodized part 300 exhibits irregular dye molecule 302 penetration into the pore structures 218. In some instances, the presence of agglomerated dye molecules 303 cause the dye molecules 302 to be disposed along the external surface of the metal oxide layer 212 instead of being disposed within the pore structures 218. The increased presence (e.g., concentration) of dye molecules 302 along the external surface of the metal oxide layer 212 may have further consequences such as a greater tendency for the color imparted by the dye molecules 302 to fade under UV radiation exposure or weathering since the dye molecules 302 are not protected by any significant thickness of the metal oxide layer 212 which can absorb the UV radiation. Equally, and undesirably, the color can transfer more readily onto other surfaces upon impact, such as when the conventional dyed anodized part 300 is subjected to an impact event. A further consequence of the agglomeration of dye molecules 302 is that the effective concentration of dye molecules (as individual, dispersed molecules in the dye solution) is reduced; therefore, the effectiveness or "activity" of the dye solution changes over time. Furthermore, post-treatment such as a subsequent lapping technique performed on the external surface of the metal oxide layer 212 would reveal irregular and non-uniform dye penetration into the pore structures 218, which results in a non-uniform color appearance. Moreover, as illustrated in FIG. 3A, the agglomerated dye molecules 303 are separated from the terminus 224 of the pore structures 218 by a distance (D) that represents an amount of unoccupied volume within the pore structure 218. Additionally, it is noted that since the openings 226 of the pore structures 218 of the conventional dyed anodized part 300 are clogged with the agglomerated dye molecules 303, any subsequent color dyeing process of the conventional dyed anodized part 300 will yield little to no additional uptake of the dye molecules 302. Accordingly, the conventional dyed anodized part 300 is characterized as having a color drift (dE) outside of color tolerances.

Figure 3B:
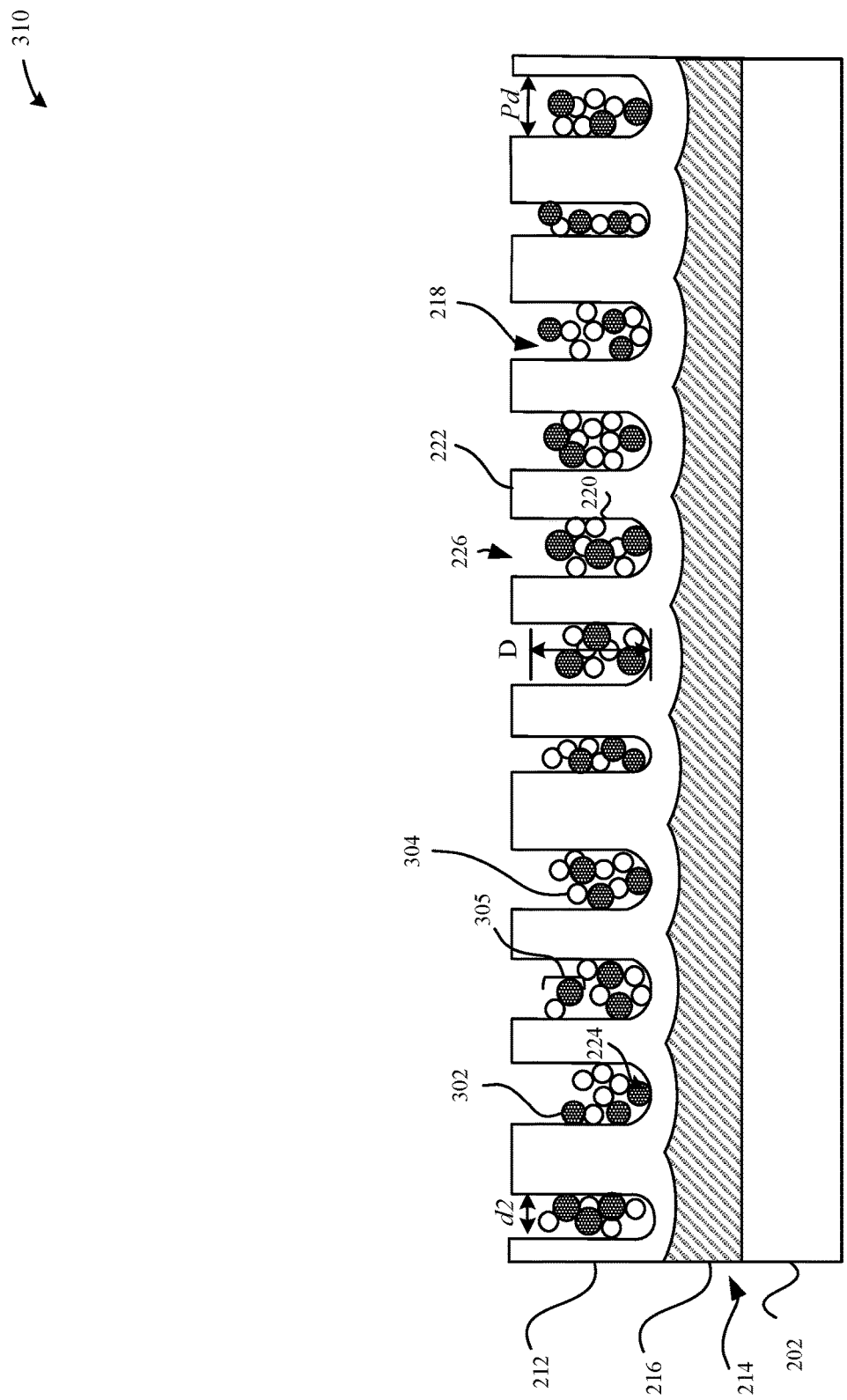
FIG. 3B illustrates a cross-sectional view of a metal oxide layer having pore structures that include dye molecules having interactions with dispersion agents, in accordance with some embodiments.

FIG. 3B illustrates a cross-sectional view of a dyed anodized part 310 subsequent to exposure to a chemically stabilized dye solution having a dispersion agent, in accordance with some embodiments. In contrast to the conventional dyed anodized part 300, the dyed anodized part 310 includes dye molecules 302 that have an average size that is less than the average size of the dye molecules 302 of the conventional dyed anodized part 300 such that the dye molecules 302 more uniformly penetrate through the pore structures 218. Additionally, the dyed anodized part 310 can include dispersion molecules 304 of a dispersion agent that are disposed within the pore structures 218.

In some embodiments, the dispersion molecules 304 can include any number of aromatic rings while the dye molecules 302 can also include any number of aromatic rings. In some examples, the dispersion molecules 304 can include two fused aromatic rings that share π electrons. In some embodiments, it can be preferable for the dispersion molecules 304 to be smaller than the dye molecules 302, thereby enabling the dispersion molecules 304 to have greater mobility in the chemically stabilized dye solution such that the dispersion molecules 304 are more likely to surround and interact with the dye molecules 302 than the dye molecules 302 are to interact with each other. Additionally, the decreased size of the dispersion molecules 304 can ensure that these dispersion molecules 304 do not greatly increase the effective size of the dye molecules 302 when they interact with the dye molecules 304, thereby forming dispersion-dye agglomerates which can still easily penetrate the pore structures 218 of the metal oxide layer 212 when multiple dispersion molecules 304 surround a single dye molecule 302. To promote interaction, the dispersion molecule 304 can be associated with a slight positive charge, while the dye molecule 302 can be associated with a slight negative charge. Thus, in some instances, the dye molecule 302 and the dispersion molecule 304 can also form a π stacking system—albeit, a disordered stacking system which cannot readily propagate or progress any further and is thus of relatively limited size (e.g., diameter d2, of thickness of about 1.5 nm), which remains smaller than the original maximum dimension (d1) and is significantly less than the size of the more extensively stacked and agglomerated dye molecules 303. In particular, in the π stacking system, the π orbitals of the aromatic rings of the dispersion molecule 304 compete for the same π orbitals of the aromatic rings of the dye molecules 302. The agglomerated mass 305 can include a dye molecule 302 and a dispersion molecule 304 that form π-π interactions among themselves.

As illustrated in FIG. 3B, the number of agglomerated dye molecules 303 in the dyed anodized part 310 is significantly reduced and/or eliminated relative to the conventional dyed anodized part 300, as described with reference to FIG. 3A. Instead a combination of individual dye molecules 302 and dispersion molecules 304 are disposed within the pore structures 218 of the metal oxide layer 212. Beneficially, the openings 226 of the pore structures 218 can remain generally exposed to permit for additional dye molecules 302 to be absorbed more deeply within the volumes of the pore structures 218. In some examples, subsequent to the color dyeing process, the molar ratio of the dispersion molecule 304 relative to the dye molecules 302 present in the pore structures 218 of the dyed anodized part 310 is at least about 2:1. In some examples, the molar ratio of the dispersion molecule 304 relative to the dye molecules 302 present in the pore structures 218 of the dyed anodized part 310 is between about 2:1 to about 6:1. As a result of the chemically stabilized dyeing process, the dyed anodized part 310 exhibits significantly improved dye molecule 302 penetration and absorption. FIG. 3B illustrates that the distance between the terminus 224 and the dye molecules 302 is significantly reduced as additional dye molecules 302 are enabled to be taken into the volumes of the pore structures 218. Whereas an agglomerated conventional dye solution may, for instance, limit dye molecule 302 penetration to the outer micron of the pore structures 218 of the metal oxide layer 212 (with more than half of the final dye concentration residing within the outer quarter of the metal oxide layer 212), a chemically stabilized dye solution can cause the dye molecules 302 to penetrate far more uniformly into the pore structures 218. Thus, the chemically stabilized dye solution can yield a greater concentration at the outer surface of the metal oxide layer 212 (a natural consequence of dye uptake mechanisms), but the outermost quarter of the oxide will typically have less than half of the full dye concentration. As well as the afore-mentioned improvements in the dye uptake into the metal oxide layer 212, it should be noted that the chemically stabilized dye solution is more uniform. In a conventional dye solution where agglomeration of dye molecules 302 occurs, the effective concentration of individual dye molecules 302 is correspondingly reduced and its effectiveness in dyeing further parts is also correspondingly, and uncontrollably changing. For example, if the dye molecules 302 form an average of one pi-bond to another dye molecule 302, the effective concentration of the dye molecules 302 in the conventional dye solution is halved. Consequently, this can be problematic in controlling coloring of metal parts in large mass production runs, as exemplified in FIG. 8 described below.

Figure 3C:
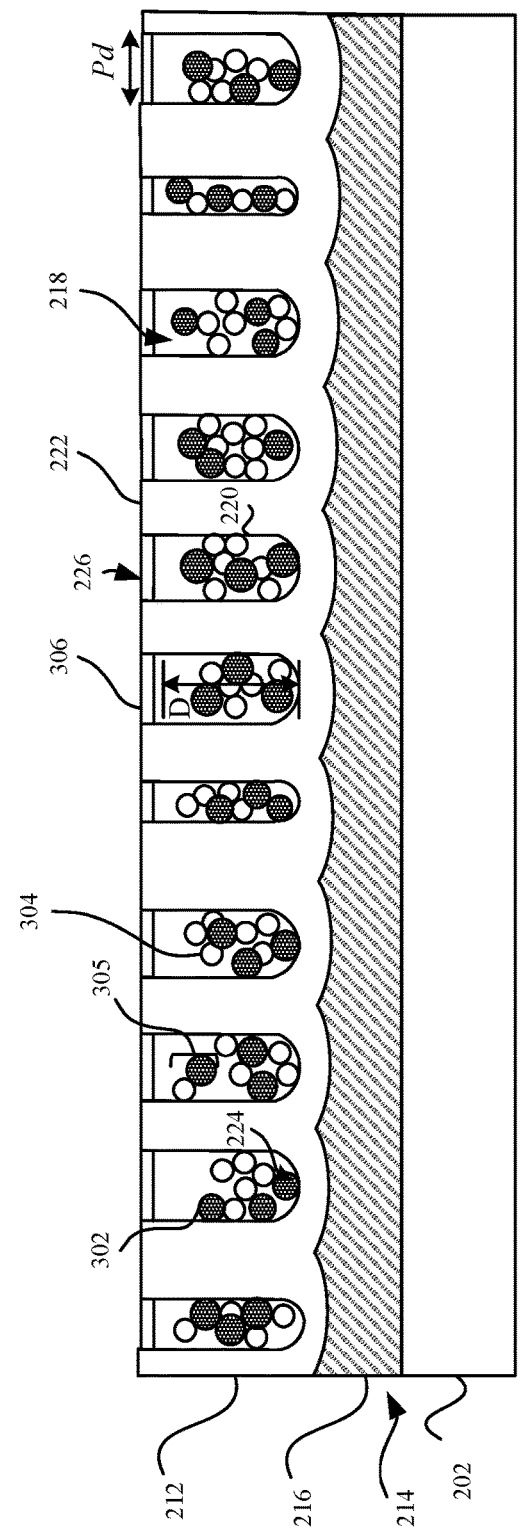
FIG. 3C illustrates a cross-sectional view of the metal oxide layer illustrated in FIG. 3B subsequent to a sealing process, in accordance with some embodiments.

FIG. 3C illustrates a cross-sectional view of the dyed anodized part 310 subsequent to a sealing process, in accordance with some embodiments. In particular, FIG. 3C illustrates a sealed dyed anodized part 320 having pore structures 218 that are sealed with a sealant 306, such as a sealant layer, sheet, or plug that covers the openings 226 to the pore structures 218 and/or fills or partially fills in the unoccupied volumes of the pore structures 218.

According to some embodiments, the sealant 306 can prevent contaminants from entering the pore structures 218. In some instances, the sealant 306 can also settle towards the terminus 224 of the pore structures 218. In some examples, the sealant 306 can include aluminum hydroxide that may include some dispersion molecules 304 of the dispersion agent (e.g., naphthalene sulfonic acid, etc.). The sealing process, as described in greater detail herein, can utilize the dispersion agent in order to facilitate in forming the sealant 306, for example, by acting as a wetting agent. Beneficially, in this manner, the dispersion agent is chemically compatible with the sealant 306 and does not impair the effectiveness of the sealing process. In some examples, the sealant 306 can also include trace amounts of the dispersion agent (e.g., as an impurity).

Figure 4A:
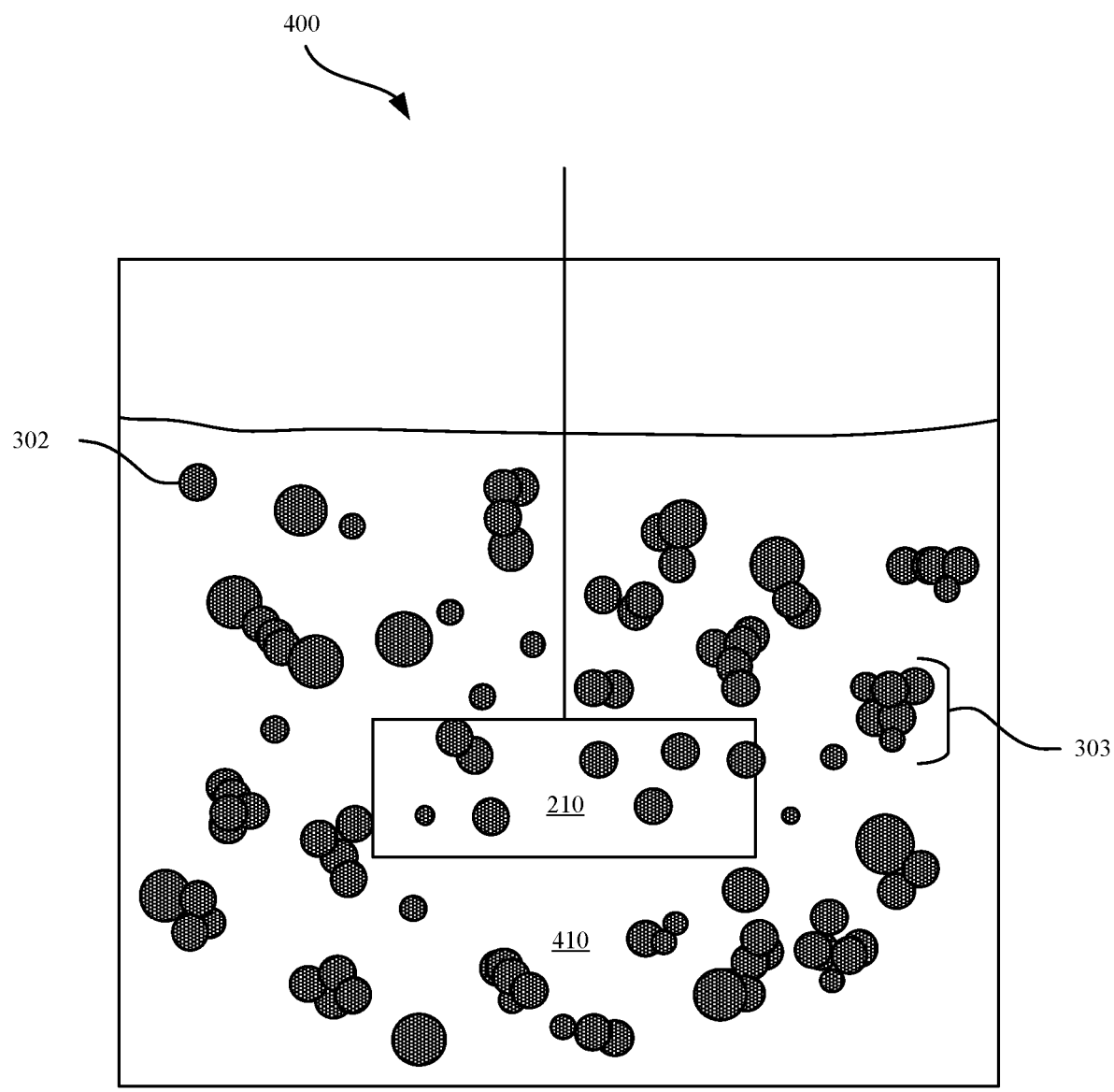
FIG. 4A illustrates an un-stabilized color dye bath having dye molecules, in accordance with some embodiments.

FIG. 4A illustrates a schematic view of a container 400 suitable for dyeing an anodized part e.g., the anodized part 210 by utilizing an un-stabilized color dye solution 410 that does not include dispersion agents, in accordance with some examples. In particular, FIG. 4A illustrates an exemplary scenario of a color dyeing process, where, after one day of uninterrupted mixing, the un-stabilized color dye solution 410 exhibited quick agglomeration of the dye molecules 302 to form multiple agglomerated dye molecules 303, which can result in visible cloudiness within the un-stabilized color dye solution 410. In some examples, the un-stabilized color dye solution 410 exhibited agglomeration of dye molecules 302 almost immediately after being mixed. Consequently, subsequent to the dyeing process, the anodized part 210 exhibited impaired color uptake and penetration as the color dye shifted outside of color tolerance after just one day, as illustrated by the conventional dyed anodized part 300. Moreover, the effective concentration of individual dye molecules 302 in the un-stabilized color dye solution 410 has significantly reduced from its initial state (and will typically continue to reduce over time), thereby changing the effective activity of the un-stabilized color dye solution 410 in an uncontrolled manner, which can result in corresponding changes to the performance of the un-stabilized color dye solution 410 which can detract from color consistency during large mass production which can affect yield, as exemplified in FIGS. 7-8 described below.

Figure 4B:
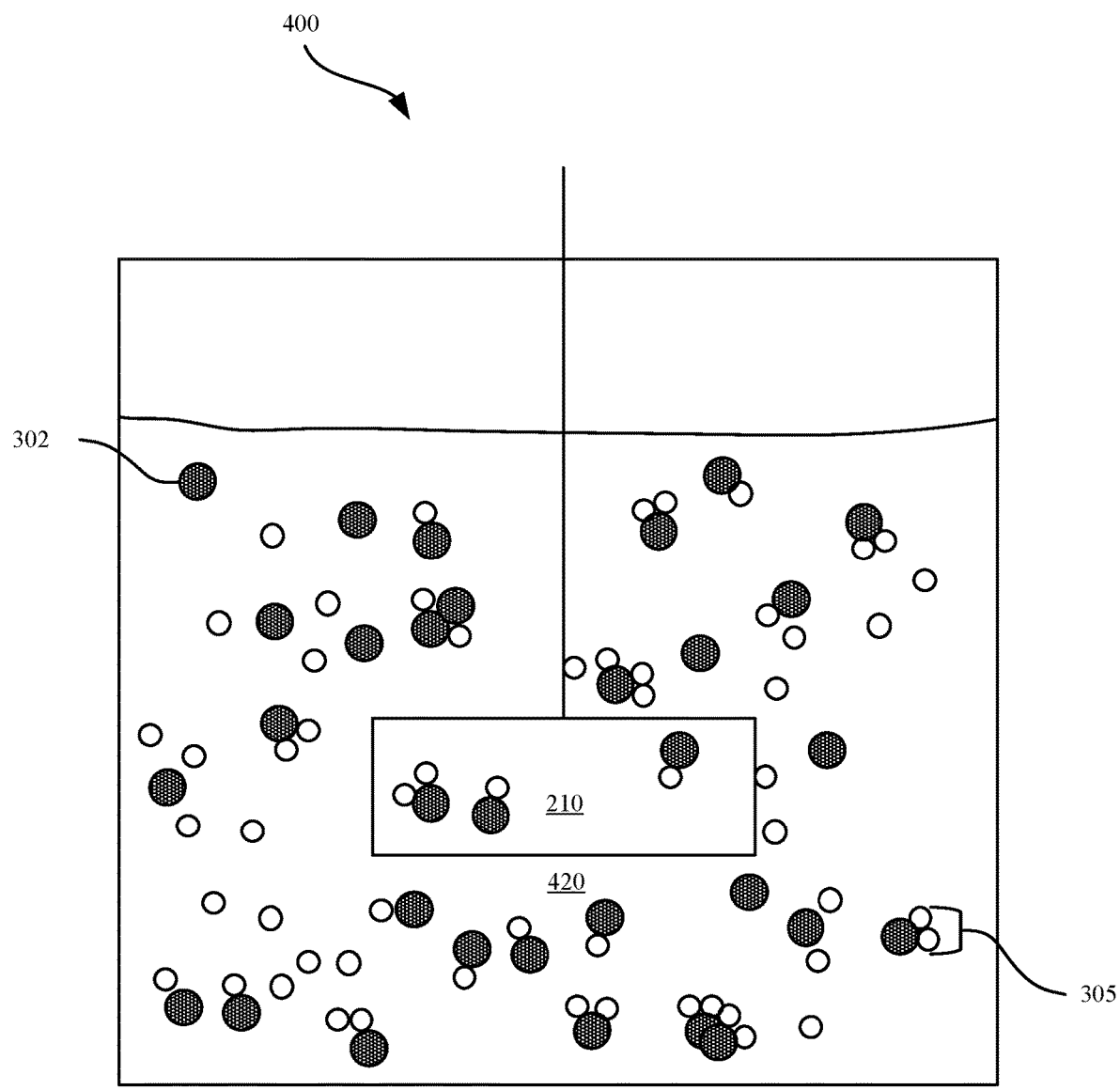
FIG. 4B illustrates a chemically stabilized color dye bath having dye molecules and a dispersion agent, in accordance with some embodiments.

FIG. 4B illustrates a schematic view of a container 400 suitable for dyeing an anodized part—e.g., the anodized part 210—by utilizing a chemically stabilized color dye solution 420 that includes dye molecules 302 and dispersion agents, in accordance with some examples. In particular, FIG. 4B illustrates an exemplary scenario of a color dyeing process where the chemically stabilized color dye solution 420 was sealed and allowed to mix for several consecutive days uninterrupted. The chemically stabilized color dye solution 420 was operated under similar dyeing conditions as the un-stabilized color dye solution 410, including temperature of the bath, amount of pH level, amount of agitation, etc. The chemically stabilized color dye solution 420 caused the dye to remain within the color tolerance longer. Additionally, the chemically stabilized color dye solution 420 exhibited significantly less cloudiness and multiple dense particulates relative to the un-stabilized color dye solution 410. In some examples, the significantly decreased cloudiness can be attributed to the diminished presence of agglomerated masses 305 and/or agglomerated dye molecules 303.

According to some examples, the chemically stabilized color dye solution 420 can include 1.0 of the dispersion molecules 304 and about 0.3-0.5 g/l of the dye molecules 302. In some examples, the concentration of the dispersion molecule 304 in the chemically stabilized color dye solution 420 is between about 0.5 g/l to about 2.5 g/l. In some examples, the molar ratio of the dispersion molecules 304 to the dye molecules 302 in the chemically stabilized color dye solution 420 is at least about 2:1. In some examples, the molar ratio between the dispersion molecules 304 and the dye molecules 302 can range between about 2:1 to about 6:1. According to embodiments, in order to reduce ordered stacking among the dye molecules 302, the chemically stabilized color dye solution 420 may require at least one dispersion molecule 304 per each active site (e.g., π orbitals) of the dye molecule 302 in order to chemically stabilize the color dyeing process. In some examples, the dispersion agent can include naphthalene sulfonic acid.

Figure 5:
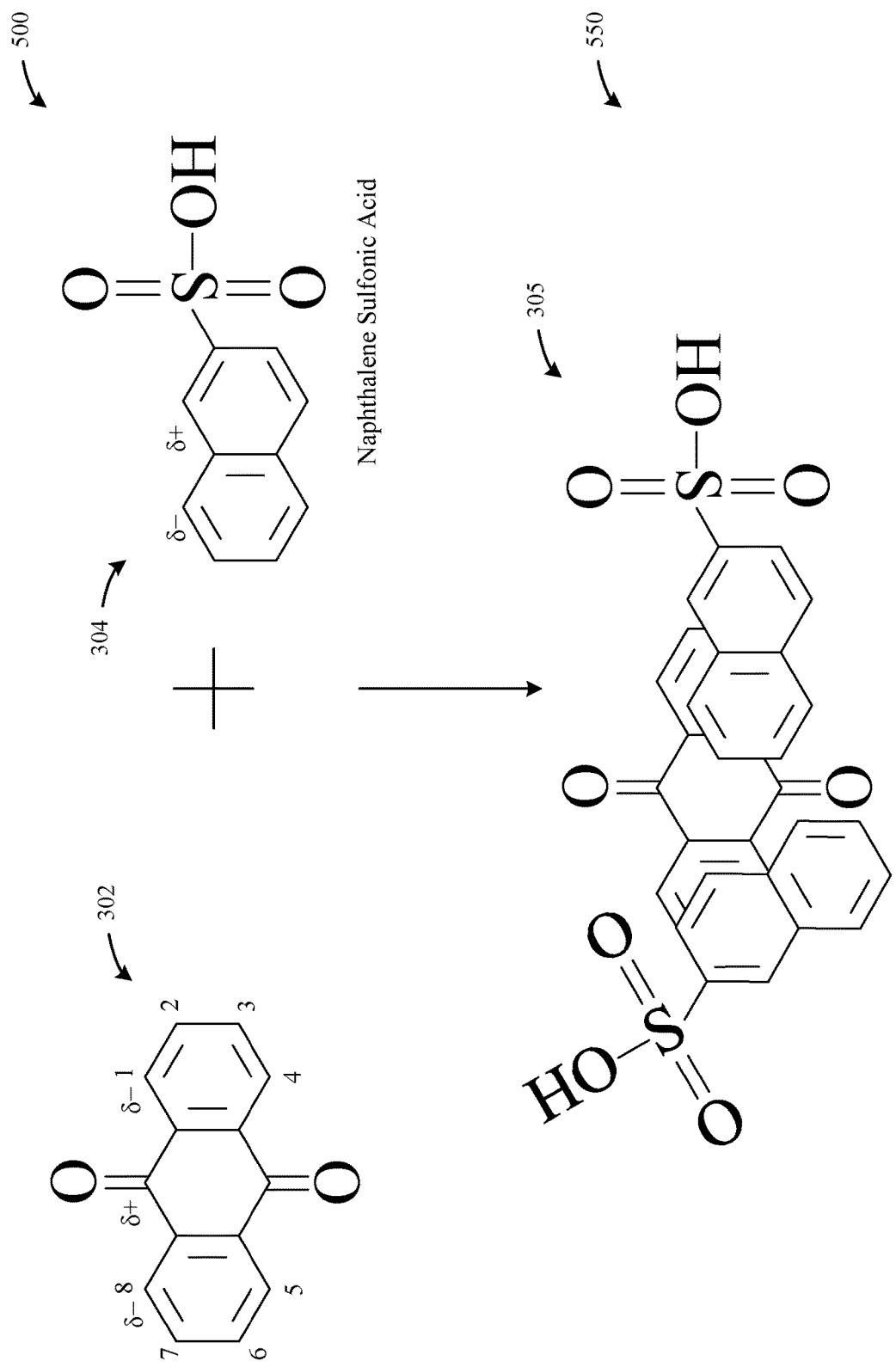
FIG. 5 illustrates example schematic diagrams of the effects of a dispersion agent on dye molecules, in accordance with some embodiments.

FIG. 5 illustrates exemplary schematic diagrams of the effects of dispersion agents—e.g., dispersion molecules 304—on dye molecules—e.g., dye molecules 302—in conjunction with a chemically stabilized color dyeing process. In particular, FIG. 5 illustrates an exemplary schematic diagram 500 of a color dyeing process that includes dye molecules 302 having any number of aromatic rings. For example, the dye molecule 302 can include three fused benzene rings (e.g., naphthalene, etc.). In naphthalene, the presence of a third aromatic ring can absorb the disruption of the electrons in the π orbitals of the first and second aromatic rings. In some examples, the dye molecules 302 can refer to an anthracene, such as an anthraquinone having a molecular formula of $C_{14}H_8O_2$.

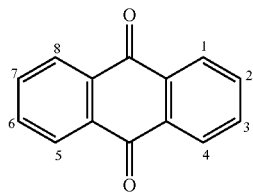 [SMILES: O=C1c2ccccc2C(=O)c2ccccc21]

Additionally, the dye molecules 302 can include extensive conjugated double bond system that may contribute to π stacking. In some examples, the dye molecules 302 can include functional groups that are responsible for imparting the dye molecules 302 with a specific color. Some examples of functional groups that can be added to the aromatic ring can include hydroxyl (—OH) and amino functional groups (—$NH_2$, —NHR, and —$NR_2$). Additionally, in some examples, the functional groups can include sulfonic acid group (—$SO_3H$), a carboxylic acid group (—COOH), or a sodium salt of an acid (e.g., $SO_3Na$). Additionally, the aromatic rings can include functional groups (some of which may have partial negative or positive charges). As a result, the dye molecules 302 can exhibit slightly positive or slightly negative charges at each aromatic ring.

FIG. 5 further illustrates in the exemplary schematic diagram 500 a dispersion molecule 304—e.g., naphthalene sulfonic acid—that interacts with the dye molecule 302. In particular, the dispersion molecule 304 (e.g., naphthalene sulfonic acid) can be characterized as having electronic delocalization due to having the aromatic rings. The delocalized π system within the dispersion molecule 304 is designed/selected to match a delocalized structure of the dye molecules 302 such that the small and relatively mobile dispersion molecules 304 may favorably interact with the delocalized structure of the dye molecules 302, and in doing so, impair interactions between the dye molecules 302. The interactions between one of the dye molecules 302 and one or more dispersion molecules 304 causes the full π system of the dye molecule 302 to be less exposed/less open to further interactions, thereby rendering the dye molecule 302 less likely to form further interactions with other dye molecules 302. Moreover, functional groups on the dispersion molecule 304 can also hinder intermolecular interactions among the dye molecules 302 Thus, even in instances when the dispersion molecule 304 and dye molecule 302 form a π stacking system (e.g., disordered stacking system), as illustrated in exemplary schematic diagram 550, these molecules are not perfectly lined up and instead form agglomerated masses 305 having sizes that are significantly less than the size of the agglomerated dye molecules 303. Because the dispersion molecules 304 have a different molecular size and shape than the dye molecules 302, the addition of dispersion molecules 304 interfere with the orderly π stacking of dye molecules 302, thereby preventing and/or reducing the number of agglomerated dye molecules 303. In turn, the dispersion molecules 304 cause the dye molecules 302 to have, on average, a smaller size in a chemically stabilized dye bath than corresponding dye molecules 302 of the non-stabilized dye bath, which results in greater dye molecule 302 penetration into the pore structures 218 and more uniform absorption into the pore structures 218.

In some embodiments, the dispersion molecule 304 can include one or more aromatic rings and a sulfonic group. In particular, the sulfonic group is a member of an organosulfur compound having a general molecular formula of R—S(=O)$_2$—OH, where R is the remaining part of the molecule, and the S(=O)$_2$—OH group is a sulfonyl hydroxide. Some examples of organic dispersion agents can include naphthalene, which is characterized as having a chemical formula of $C_{10}H_8$ and a pair of fused benzene rings.

Figure 6:
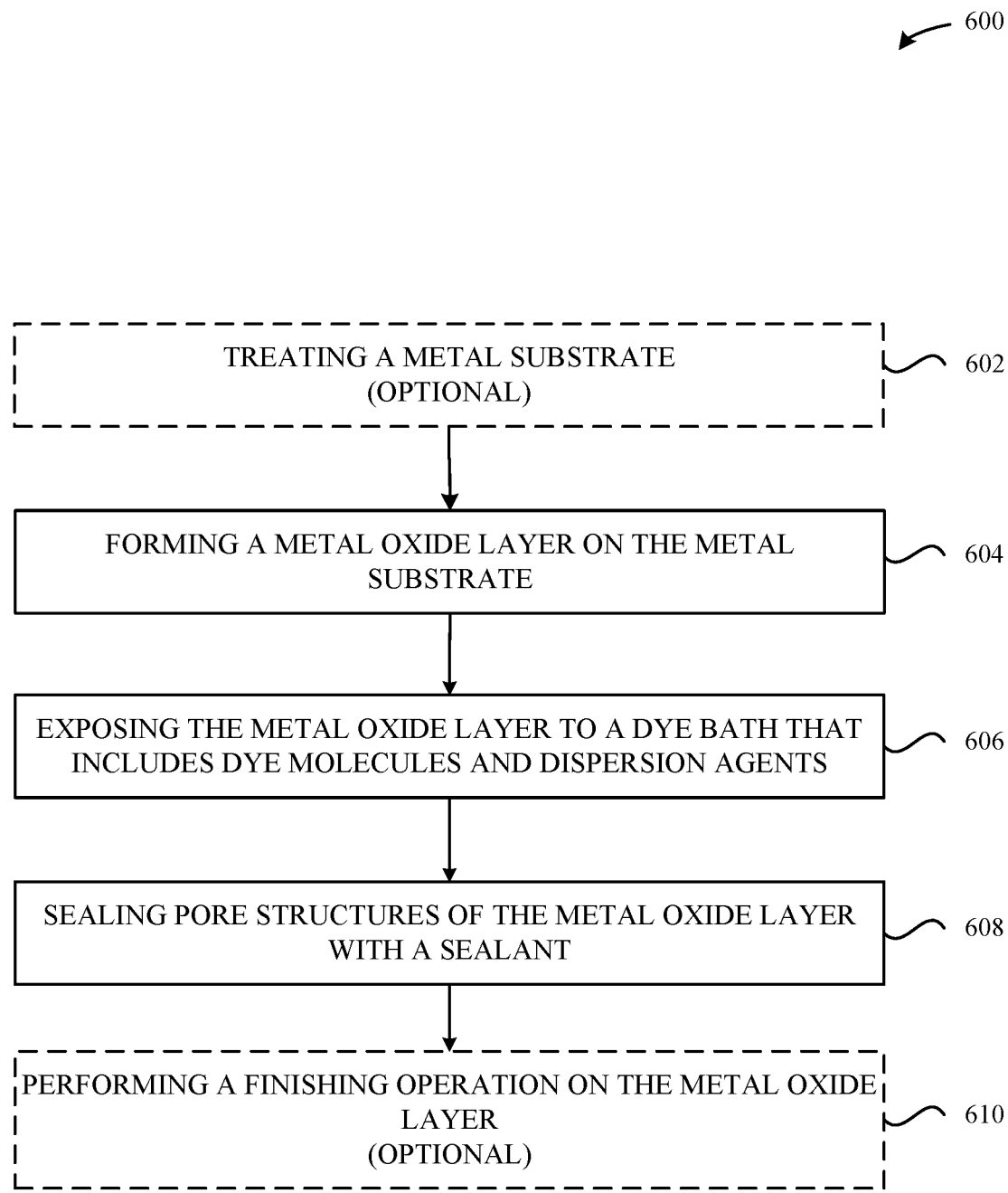
FIG. 6 illustrates a method for processing a metal part, in accordance with some embodiments.

FIG. 6 illustrates a method for forming a dyed anodized part, according to some embodiments. As illustrated in FIG. 6, the method 600 begins at step 602, where a metal substrate—e.g., the metal substrate 202—is optionally treated prior to anodizing a portion of the metal substrate 202. In some examples, at step 602, a surface treatment (or pre-texturizing process) is optionally performed on a surface of the metal substrate 202. In some examples, the surface treatment can include polishing the surface of the metal substrate 202 such as to form a mirror polished surface, corresponding to a generally uniform surface profile. In particular, polishing techniques can include chemical polishing, which involves exposing the metal substrate 202 to acidic solution, e.g., sulfuric acid and phosphoric acid solutions. In some examples, the polishing includes one or more mechanical polishing processes. In some embodiments, the surface treatment is an etching process that forms a textured surface characterized as having a matte appearance. In particular, the textured surface can be formed as a result of at least one of a blasting, etching, or chemical polishing process.

At step 604, an oxidation process (or anodization process) can be performed to form a metal oxide layer 212 disposed on the metal substrate 202. During and subsequent to the oxidation process, the metal oxide layer 212 having a number of pore structures 218 can be formed longitudinally throughout the metal oxide layer 212.

According to some examples, the oxidation process can be performed in a sulfuric acid solution. In some examples, the oxidation process is performed in a phosphoric acid or oxalic acid solution, which can form pore structures 218 having wider diameters relative to corresponding pore structures 218 formed during the sulfuric acid oxidation processes. In some embodiments, oxidation of the metal substrate 202 can be performed through electrochemical oxidation process. In some embodiments, the thickness of the metal oxide layer 212 can be controlled via a plurality of factors, such as the duration of time in which the metal substrate 202 is exposed to the oxidation process. In other words, the longer the time in which the metal substrate 202 is exposed to the oxidation process, the thicker the formation of the metal oxide layer 212. According to some embodiments, subsequent to the oxidation process, the metal oxide layer 212 and an interface region 214 can be formed from the metal substrate 202. In some examples, the interface region 214 can represent a non-porous physical structure that prevents corrosion and delamination agents from coming into contact with the metal substrate 202.

At step 606, the metal oxide layer 212 can be exposed to a chemically stabilized color dye solution 420 that includes dye molecules 302 and dispersion molecules 304. In particular, the dye molecules 302 can impart a variety of specific colors to the metal oxide layer 212. By way of example, the dye molecules 302 can impart at least one of a red, pink, orange, gold, green, blue, purple, gray, or black color to the metal oxide layer 212. According to some examples, non-covalent interactions can be formed between the dye molecules 302 and the dispersion molecules 304 through disordered stacking. As a result, the disordered stacking between the dye molecules 302 and the dispersion molecules 304 can prevent and/or minimize more extensive agglomeration among the dye molecules 302 so as to generally prevent the dye molecules 302 from growing in size to a significant fraction of the diameters of the pore structures 218 of the metal oxide layer 212, and thus preventing the openings 226 of the pore structures 218 from becoming clogged, thereby ensuring deeper and more uniform penetration of the dye molecules 302 into the pore structures 218. By minimizing or limiting (e.g., no more than 5%) agglomeration of the dye molecules 302, the chemically stabilized color dye solution 420 can retain its original character and performance over time, and can produce more consistent results within a given specification over a much greater time period during mass production of these anodized parts.

Subsequent to the dyeing process, at step 608, openings 226 of the pore structures 218 of the anodized part can be sealed with a sealant in conjunction with a sealing process. In some embodiments, the sealing process can be preceded and/or performed in conjunction with an operation for determining whether an amount of the dye molecules 302 that are imbued within the pore structures 218 satisfies a threshold amount of dye penetration. In response to determining that the amount of the dye molecules 302 satisfies the threshold amount, then the sealing process can be performed. In some examples, the amount of the dye molecules 302 that penetrate the pore structures 218 can be determined using a colorimeter. For instance, the colorimeter can be utilized to determine if the dye molecule 302 penetration within the metal oxide layer 212 is generally uniform if there is a generally similar amount of dimensional color values (e.g., L*a*b* values) across the external surface 222 of the metal oxide layer 212.

In some examples, the sealing process can utilize a sealing solution, such as a near-boiling (e.g., 96° Celsius or more) solution of nickel acetate. For example, the nickel acetate can promote the hydration of the metal oxide layer 212 into an aluminum oxide hydroxide (such as boehmite). Additionally, the nickel acetate can cause swelling of the pore walls and forming a plug at outer extremities of the pore structures 218 that form a continuous barrier over the external surface 222 of the dyed anodized part. Beneficially, the sealant 306 can prevent contaminants, corrosion agents, and other compounds that may harm the metal substrate 202 from coming into contact with the metal substrate 202. However, the nickel ions of the nickel acetate solution can cause an undesirable sealant smut to form on the external surface that damages and/or degrades the metal oxide layer 212. Beneficially, in some examples, naphthalene sulfonic acid can be utilized during the sealing process in order to prevent the nickel ions from building up on the external surface of the metal oxide layer 212. In particular, naphthalene sulfonic acid can be used as a wetting agent to facilitate the sealing solution to flow along the external surface of the metal oxide layer 212. As previously described herein, naphthalene sulfonic acid may be implemented during both the color dyeing process and the sealing process. Beneficially, the use of naphthalene sulfonic acid as a dispersion agent can prevent compromising the effectiveness of the seals of the pore structures 218.

At step 610, one or more finishing operations can optionally be performed on an external surface of the metal oxide layer 212. For instance, the finishing operations can adjust a surface finish of the external surface of the metal oxide layer 212. In particular, the finishing operations can refer to a polishing or buffing operation that imparts the metal oxide layer 212 with a uniform and shiny appearance. In some examples, in samples of the metal part where the depth of penetration by the dye molecules 302 is very limited (e.g., due to large, agglomerated dye molecules 303 which cannot penetrate the pore structures 218 and readily block the passage of additional dye molecules 302 into the pore structures 218), such a finishing operation can be difficult to perform without rapid, uncontrolled color shifts. In contrast, if the dye molecules 302 penetrate relatively deeply and uniformly into the pore structures 218, finishing operations such as polishing or lapping operations can be conducted with minimal dye removal and color change for a given material removal level, and thus are more readily controlled and applied.

Figure 7:
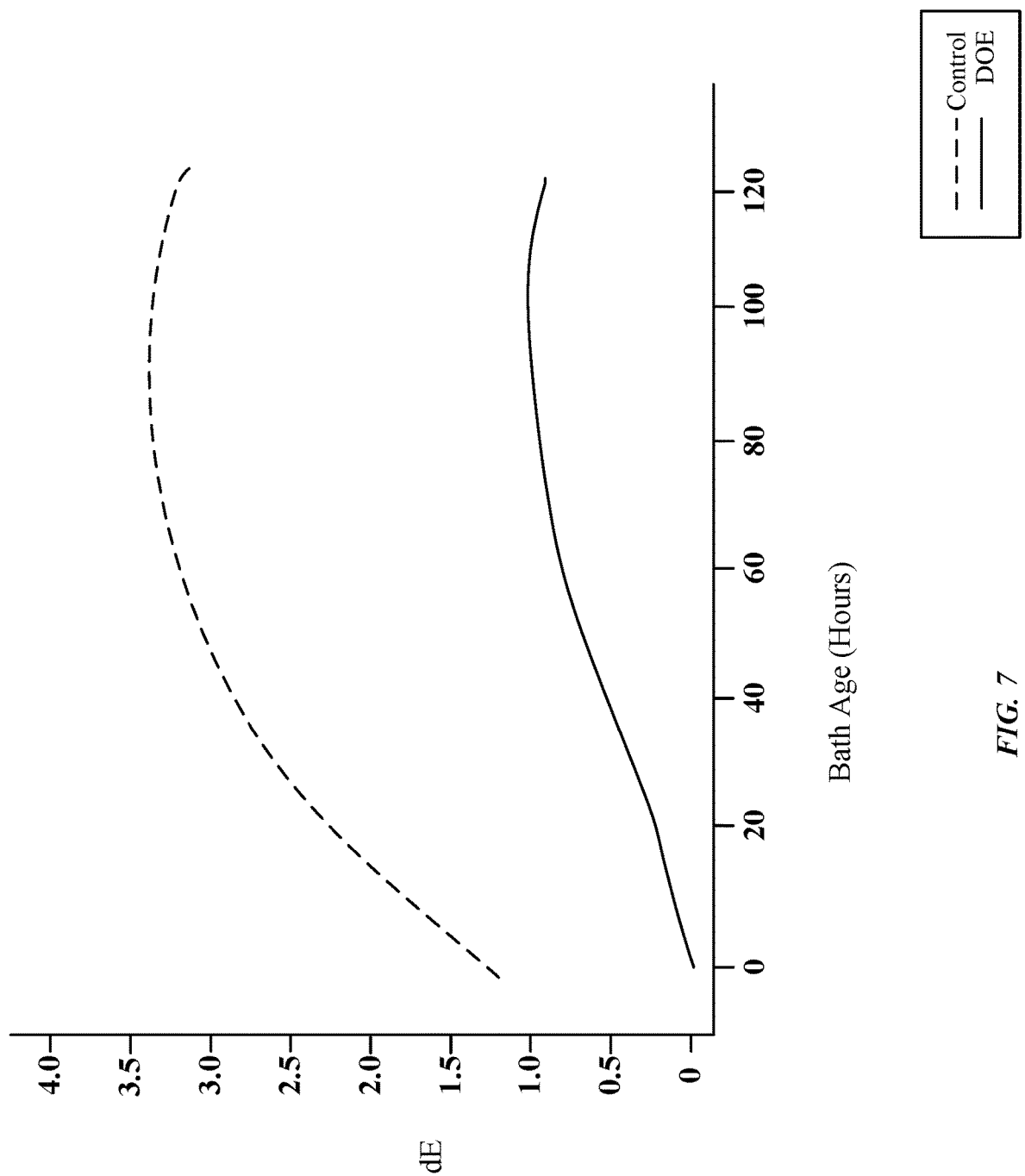
FIG. 7 illustrates a graph indicating a relationship of a dE color shift as a function of an age of a chemically stabilized color dye bath, in accordance with some examples.

FIG. 7 illustrates a graph indicating a relationship of color shift as a function of an age of a chemically stabilized color dye bath, in accordance with some examples. In particular, the graph indicates a causal relationship between the color shift and a dispersion agent that is present in the chemically stabilized color dye bath. The color shift is measured by (dE) that represents an overall difference between two colors by taking into consideration a distance from a color point in five different directions hue, chroma, etc.). In particular, a dE of 1.0 approximately represents the smallest color difference that is readily perceivable to the human eye. A dE of less than 1.0 is generally difficult for the average human to detect, while a dE that is equal to or greater than 1.0 can be generally perceived by the average human.

Referring back to FIG. 7, in accordance with exemplary trials, a dye solution was included in two flasks: (i) a first flask including a control formula, and (ii) a second flask including a design of experiment (DOE) formula. In the exemplary trials, the control formula did not include a dispersion agent, while the DOE formula included between about 0.5 g/l to about 2.5 g/l of naphthalene sulfonic acid. The first and second flasks were observed under identical illumination conditions as measured by a colorimeter. Additionally, no corrections were made to the dye molecules 302 or concentration of dye molecules 302 present in the first and second flasks during the exemplary trials.

As illustrated in FIG. 7 the first flask including the control formula exhibited a significant increase in color shift almost immediately after the control formula was formed. In one sample, the control formula exhibited an immediate color shift of greater than 1.0 when the age of the dye bath (i.e., from initial mixing) was less than one hour. In other samples, the control formula exhibited a color shift of greater than 2.0 when the age of the dye bath was at least 20 hours. In other samples, the control formula exhibited a color shift of greater than 3.0 when the age of the dye bath was greater than 60 hours. Contrarily, the DOE formula was able to produce a color shift within spec limits throughout the experimental trials. In one sample, the second flask including the DOE formula exhibited a color shift of about 0.9 when the color dye bath was 80 hours old. In another sample, the DOE formula exhibited a color shift of between about 0.5 and about 0.95 when the color dye bath was between 60 hours to 120 hours old.

Thus, the control formula and the DOE formula exhibited significant differences in color shift that can be attributed to the presence of the dispersion agent. Accordingly, because the color shift for the DOE formula is less than the dE threshold (~1.0), the changes in color in the DOE formula cannot readily be perceived by the human eye. Beneficially, the DOE formula is effective in significantly prolonging the life of the dye solution in producing multiple flight bars of dyed anodized parts that are suitable for consumer use. However, because the control formula has a color shift of greater than 1.0, the color shift is clearly perceivable by the human eye. During the course of the experimental trials, the DOE formula has a life that is at least two to three times greater than the control formula.

Figure 8A:
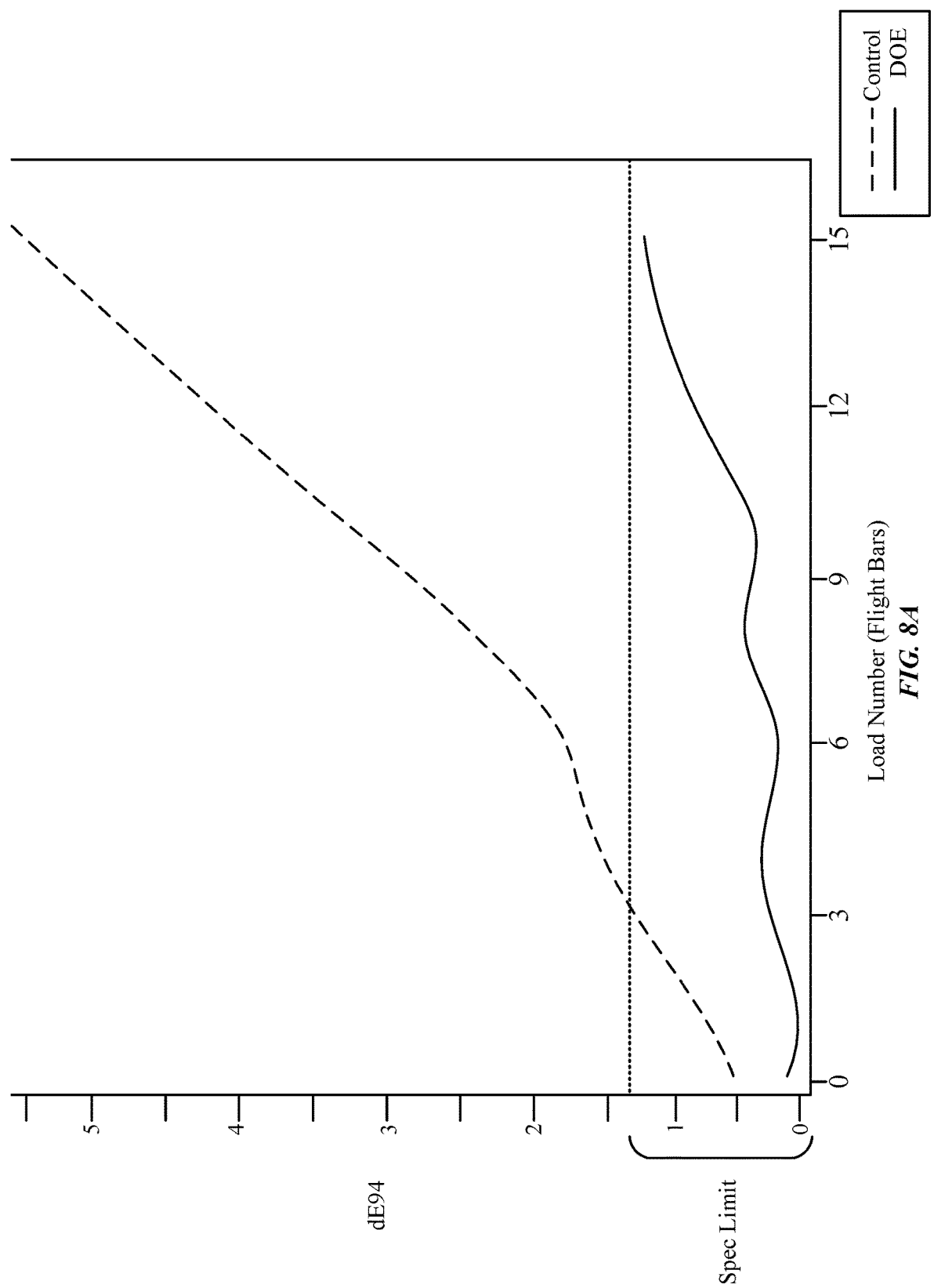
FIG. 8A illustrates a graph indicating a relationship of a dE94 color shift relative to a number of flight bars that are dyed using a chemically stabilized color dye bath, in accordance with some examples.

FIG. 8A illustrates a graph indicating a relationship of a dE94 color shift relative to a number of flight bars that are dyed using a chemically stabilized color dye bath, in accordance with some examples. The dE94 color shift value is based on CIE 1994 and takes into account certain weighting factors for lightness, chromaticity, and hue values. In particular, dE94 color shift converts the given L*a*b* color-opponent dimension values into L*c*h* values. During the experimental trials, load numbers (e.g., flight bars) were dyed using a first flask that includes a control formula and a second flask that includes a DOE formula. In the experimental trials, at least two flight bars were run consecutively each day for at least two consecutive days in each of the first and second flasks. In this example, a single flight bar denotes between about 50 to 300 anodized parts. In the experimental trials, the DOE formula included naphthalene sulfonic acid, while the control formula did not. During the trials, pH values for both the first and second flasks were maintained within a specific pH range. No corrections were made to the dye molecules 302 present in the first and second flasks during the experimental trials. Furthermore, a color shift target of dE94 of 1.3 or less was established for the control formula and the DOE formula.

As illustrated in FIG. 8A, the flight bars dyed under DOE formula conditions remained within the spec limit throughout the duration of the experimental trials. For example, in some samples, the flight bars dyed under DOE formula conditions did not exhibit a color shift of greater than 1.3 after 15 flight bars. In other samples, the flight bars dyed under DOE formula conditions exhibited a color shift of between about 0.7 to about 1.2 after the eight flight bar. In other samples, the flight bars dyed under the DOE formula conditions exhibited a color shift of 0.1 to about 0.5 between the first and $10^{th}$ flight bars, Overall, the DOE formula produced about a 100% yield rate of flight bars satisfying the spec limit after the $15^{th}$ flight bar. In contrast, in one sample, FIG. 8A illustrates that those flight bars dyed under control formula conditions quickly produced a dE94 color shift outside of the spec limit after just the fourth flight bar was run. In other samples, FIG. 8 illustrates that flight bars dyed under control formula conditions produced color shift outside of the spec limit after just three flight bars were run. Subsequent flight bars dyed under the control formula demonstrated even more pronounced color shift in excess of a dE94 of 2.0 after the sixth flight bar. In other samples, flight bars dyed under the control formula conditions exhibited an exponential increase in color shift by the ninth flight bar, with the color shift surpassing 4.0 after the $12^{th}$ flight bar.

Figure 8B:
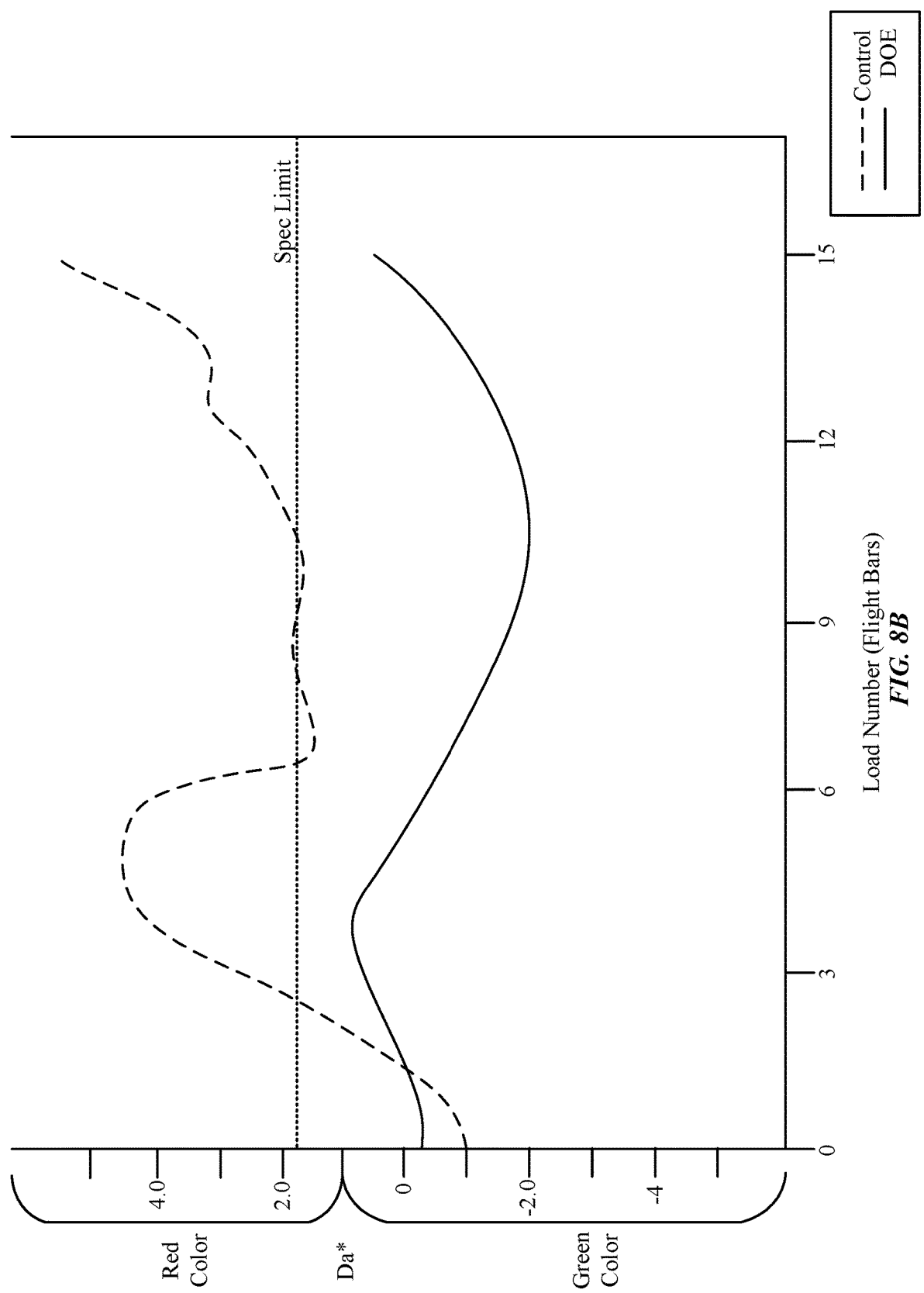
FIG. 8B illustrates a graph indicating a relationship of a da* color dimension value relative to a number of flight bars that are dyed using a chemically stabilized color dye bath, in accordance with some examples.
Figure 8C:
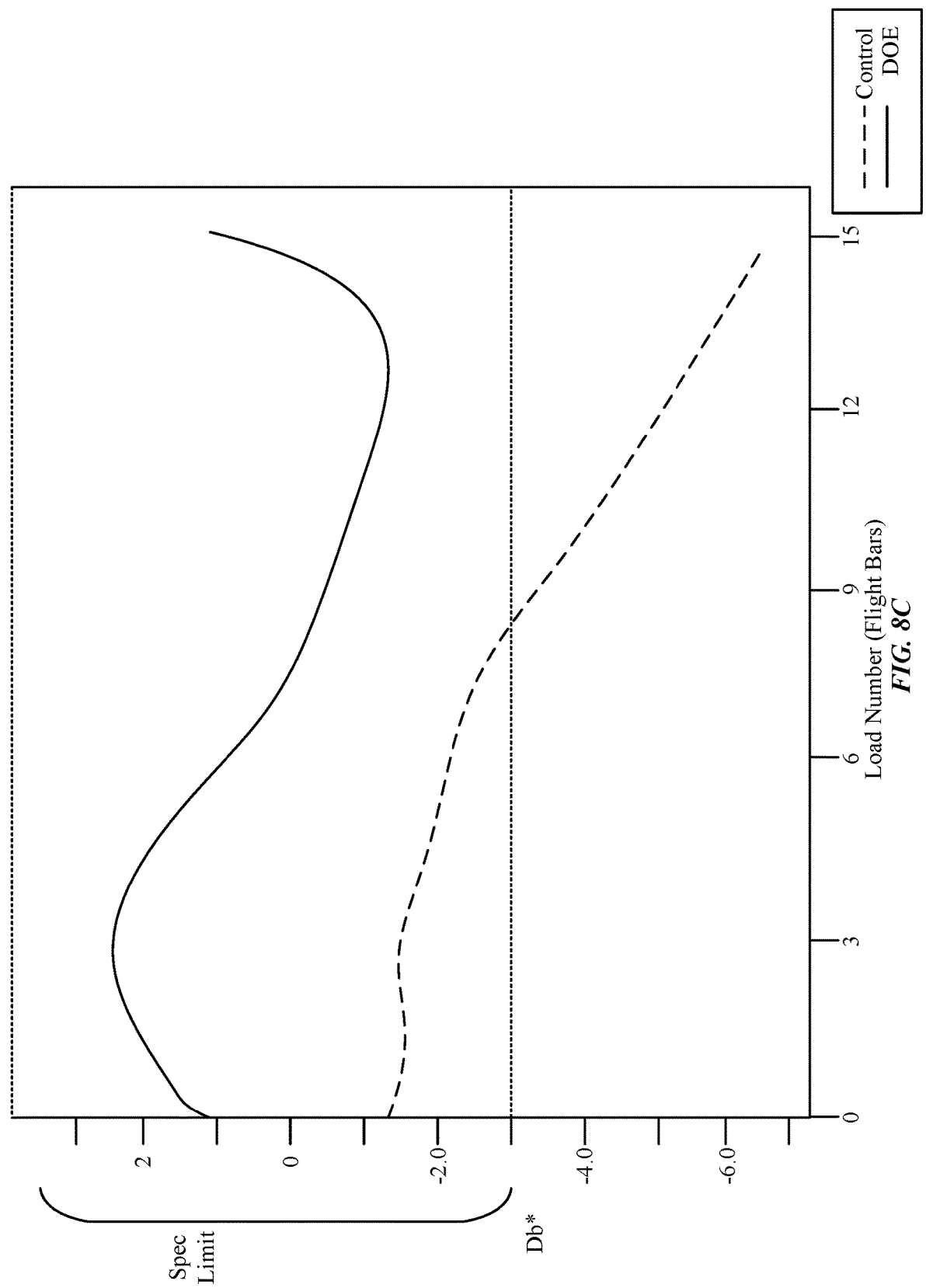
FIG. 8C illustrates a graph indicating a relationship of a db* color dimension value relative to a number of flight bars that are dyed using a chemically stabilized color dye bath, in accordance with some examples.

FIGS. 8B-8C illustrate graphs indicating a relationship of a da* color dimension value and db* color dimension value, respectively, relative to a number of flight bars that are dyed using a chemically stabilized color dye bath, in accordance with some examples. In the L*a*b color space, a relationship can be described with reference to CIE 1976 L*a*b* color-opponent dimension values as a result of chemical stabilization of the dye molecules 302 within the chemically stabilized color dye bath. The L* color opponent dimension value is one variable in an L*a*b* color space. In general, L* corresponds to an amount of lightness. L*=0 represents the darkest black while L*=100 represents white. In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

Returning back to FIGS. 8B-8C, during the experimental trials, a first flask that includes a control formula and a second flask that includes a DOE formula were used to dye consecutive runs of flight bars. During the experimental trials, pH values for both the first and second flasks were maintained within a pH range. No corrections were made to the dye molecules 302 or concentration of dye molecules 302 present in the first and second flasks during the experimental trials. In the experimental trials, at least two flight bars were run consecutively each day for at least two consecutive days in each of the first and second flasks. In this example, a single flight bar denotes between about 50 to 300 anodized parts.

FIG. 8B illustrates a graph indicating a relationship of a da* color dimension value relative to a number of flight bars that are dyed using a chemically stabilized color dye bath, in accordance with some examples. A spec limit of da* value of 1.6 or less was established for flight bars dyed using the control formula and the DOE formula. As illustrated in FIG. 8B, the flight bars dyed under DOE formula conditions remained within the spec limit throughout the duration of the experimental trial. FIG. 8B illustrates that 15 flight bars were run under DOE formula conditions, and that by the $15^{th}$ flight bar, the DOE, formula conditions produced about a 100% yield rate of flight bars that satisfied the spec limit. In contrast, FIG. 9B also illustrates that those flight bars dyed under control formula conditions produced a da* value of greater than 1.0 by the third flight bar. Additionally, in some samples, those flight bars dyed under control formula conditions produced a da* value of greater than 2.0 by the third flight bar.

FIG. 8C illustrates a graph indicating a relationship of a db* color dimension value relative to a number of flight bars that are dyed using a chemically stabilized color dye bath, in accordance with some examples. A spec limit of db* value of −3.0 or greater was established for flight bars dyed using the control formula and the DOE formula. As illustrated in FIG. 8C, the flight bars dyed under DOE formula conditions remained within the spec limit throughout the duration of the experimental trial. Overall, FIG. 8C illustrates that after 15 flight bars, the DOE formula conditions exhibited about a 100% yield rate of flight bars satisfying the spec limit during the experimental trials. In contrast, FIG. 8C illustrates that those flight bars dyed under control formula conditions quickly produced a db* value of less than −2.0 by the fifth flight bar. Although in other samples, flight bars dyed under the control formula conditions exhibited a db* value of less than −2.0 by the third flight bar. Subsequent flight bars run under the control formula demonstrated increasingly negative db* values of less than −3.0. By the seventh flight bar, the control formula produced a 0% yield rate of flight bars meeting the spec limit.

Overall, FIGS. 8A-8C illustrate that dE94 color shift values and da* and db* color-opponent dimension values can be causally related to chemical stabilization of the dye bath in the presence of the dispersion agent (e.g., naphthalene sulfonic acid). Generally, the use of the dispersion agent can stabilize color of the dyed anodized part in the da* and db* color dimension values without external process intervention (e.g., extending dye times, changing concentration of dyes, etc.).

According to some embodiments, quantifiable techniques can be implemented to detect the presence of the dispersion agent within a sealed dyed anodized part 320. According to some embodiments, the dye molecules 302 of the sealed dyed anodized part 320 can be leached or removed using a leaching solution. For example, the leaching solution can include between about 10% to about 40% of nitric acid solution. The sealed dyed anodized part 320 is exposed to a leaching solution to cause the sealant 306 that fills the pore structures 218 of the sealed dyed anodized part 320 to break down. In some examples, sealed dyed anodized part 320 is exposed for a time period of about 15 minutes or less. Subsequently, when the sealant 306 has broken down, the dye molecules 302 disposed within the pore structures 218 can be dissolved into the leaching solution. It is noted that the metal oxide layer 212 is generally unharmed while the sealed dyed anodized part 320 is exposed to the leaching solution. As the noncovalent interaction between the dye molecules 302 and the dispersion molecules 304 are generally very stable, leaching of the dye molecules 302 into the leaching solution generally does not impact these noncovalent interactions. In some examples, techniques such as ultraviolet-visible spectrometry and mass spectrometry can be utilized to determine the presence of the dispersion agent (e.g., naphthalene sulfonic acid) subsequent to dissolving the sealant 306 within the leaching solution. In some examples, the mass spectrometry can produce a quantifiable detection of the dispersion agent having a wavelength with a strong absorption peak value between about 200 nm to about 300 nm, while conventional dyed anodized part 300 that lack the dispersion agents do not display this wavelength having a strong peak value between about 200 nm to about 300 nm. More particularly, naphthalene sulfonic acid exhibits a strong absorption peak value at about 226 nm.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A part, comprising:
   a metal oxide layer defining pore structures; and
   a dispersant-dye agglomerate disposed in at least one of the pore structures, an outermost 25% of the metal oxide layer comprising less than about 50% of the dispersant-dye agglomerate, the dispersant dye agglomerate comprising:
   a dye molecule comprising an aromatic ring; and
   a dispersant molecule one or more dispersant molecules having a non-covalent interaction with the aromatic ring such that the dispersant-dye agglomerate comprises a disordered stacking structure.

2. The part of claim 1, wherein the non-covalent interaction comprises a π-π interaction among the dye and dispersant molecules.

3. The part of claim 1, further comprising:
   a sealant that at least partially fills the pore structures.

4. The part of claim 1, wherein the dispersant molecule comprises a sulfonic group.

5. The part of claim 4, wherein the dispersant molecule comprises naphthalene sulfonic acid.

6. The part of claim 1, wherein the metal oxide layer has a thickness between about 5 nanometers to about 20 micrometers, and openings of the pore structures have diameters between about 10 nanometers to about 15 nanometers.

7. The part of claim 6, wherein the disordered stacking structure has a size that is less than the diameters of the openings of the pore structures.

8. A method for dyeing a metal oxide layer of a part, the metal oxide layer defining pores having an average diameter, the method comprising:
   exposing the metal oxide layer to a stabilized dye solution, the stabilized dye solution comprising dispersant-dye aggregates having disordered stacking structures that form agglomerated dye molecules having an average size that is smaller than the average diameter of the pores, the dispersant-dye aggregates comprising:
a dye molecule having an aromatic ring; and
a dispersion molecule having a non-covalent interaction with the aromatic ring.

9. The method of claim 8, wherein an amount of the dispersant-dye aggregates having the average size that is larger than the average diameter of the pores is no greater than about 5%.

10. The method of claim 8, wherein the stabilized dye solution contains no more than about 5% of the agglomerated dye molecules comprising more than one dye molecule.

11. The method of claim 8, further comprising:
determining whether a color of the metal oxide layer that is imbued by the dispersant-dye aggregates satisfies a threshold amount; and
in response to determining that the color of the metal oxide layer satisfies the threshold amount, sealing the pores with a sealant during a sealing process.

12. The method of claim 11, wherein the metal oxide layer is exposed to a wetting agent during the sealing process, and the wetting agent comprises the dispersion molecule.

13. The method of claim 12, wherein the dispersion molecule comprises at least one aromatic ring and a sulfonic group.

14. The method of claim 8, wherein a molar ratio of the dispersion molecule to the dye molecule in the stabilized dye solution is between about 2:1 to about 6:1.

15. An enclosure for a portable electronic device, the enclosure comprising:
a metal substrate;
a metal oxide layer formed from the metal substrate, the metal oxide layer defining pore structures;
a dye molecule group having a maximum linear dimension that is less than an average diameter of the pore structures and disposed in at least one pore structure to imbue the metal oxide layer with a color, the dye molecule group comprising:
dye molecules; and
dispersion molecules comprising at least one aromatic ring having non-covalent interactions with the dye molecules such that the dye molecules are uniformly disposed within each of the pore structures.

16. The enclosure of claim 15, wherein the pore structures are generally free of agglomerated dye molecules having any linear dimension that is greater than an average diameter of the pore structures.

17. The enclosure of claim 16, wherein the dye molecules that are uniformly disposed within each of the pore structures have an average size that is less than the sizes of the agglomerated dye molecules.

18. The enclosure of claim 17, wherein the pore structures have an average diameter between about 10 to about 15 nanometers, and the average size of the dye molecules is less than the average diameter.

19. The enclosure of claim 15, wherein the dispersion molecules comprise at least one aromatic ring and a sulfonic group.

* * * * *